United States Patent

Degen

[11] Patent Number: 6,072,678
[45] Date of Patent: Jun. 6, 2000

[54] SHORT-CIRCUIT PROTECTION CIRCUIT

[75] Inventor: Martin Degen, Bad Homburg, Germany

[73] Assignee: Mannesmann VDO AG, Frankfurt, Germany

[21] Appl. No.: 09/130,626

[22] Filed: Aug. 6, 1998

[30] Foreign Application Priority Data

Aug. 21, 1997 [DE] Germany .................. 197 36 356

[51] Int. Cl.[7] .................................................. H02H 9/00
[52] U.S. Cl. ........................................... 361/58; 361/93.9
[58] Field of Search ........................... 361/54–58, 74, 361/93.4, 93.9, 98, 100, 101

[56] References Cited

U.S. PATENT DOCUMENTS 5,381,296  1/1995  Ekelund et al. .................. 361/106

FOREIGN PATENT DOCUMENTS

| 3238899 | 4/1984 | Germany | H03K 17/08 |
| 3515133 | 11/1986 | Germany | H03K 17/08 |
| 3539646 | 5/1987 | Germany | H03K 17/08 |
| 3703776 | 8/1987 | Germany | H03K 17/08 |

*Primary Examiner*—Ronald W. Leja
*Attorney, Agent, or Firm*—Martin A. Farber

[57] ABSTRACT

A short-circuit protection circuit for a switching output having a non-self-protected field-effect transistor to whose control electrode a control voltage can be supplied via an input. A series circuit comprising a timer, a switch-off release stage and a switch-off stage is provided at the control electrode of the non-self-protected semiconductor switch.

7 Claims, 1 Drawing Sheet

SHORT-CIRCUIT PROTECTION CIRCUIT

FIELD AND BACKGROUND OF THE INVENTION

The invention relates to a short-circuit protection circuit for a switching output, the circuit having a non-self-protected semiconductor switch, in particular a field-effect transistor, to whose control electrode a control voltage can be supplied via an input.

Electrical switching outputs should expediently be protected against short circuits which can occur at the output of the switch both to earth and to a supply voltage (for example to a motor vehicle supply voltage). In this case, the operating state at which the switching output switches on, becomes low-impedance, is critical and at which, at the same time, an excessively high voltage occurs across the switching output as a result of a short circuit. In the case of this type of fault, circuit parts can very quickly be destroyed. Special protection measures are required for this purpose.

Until now, it has been normal to use self-protected field-effect transistors, in particular power MOSFETs, whose drain-source path is automatically switched to have high impedance if there is a risk of overloading or overheating. It is disadvantageous in this case that such a special power MOSFET is particularly expensive. Furthermore, this type of protection circuit is not able to reproduce the normal operating state of the circuit automatically once the fault has been rectified.

SUMMARY OF THE INVENTION

The present invention is thus based on the object, in the case of a short-circuit protection circuit of the type mentioned initially, not only of achieving immediate switching-off of the output circuit stage to be protected in the event of a fault, but also to ensure that the stage is switched on again automatically once the fault has been rectified.

This object is achieved according to the invention in that a series circuit comprising a timer, a switch-off release stage and a switch-off stage is provided at the control electrode of the non-self-protected semiconductor switch.

The circuit according to the invention has the advantage that a cost-effective, non-self-protected field-effect transistor can be used, in which case it is possible to produce the protection circuit with a small number of additional components.

In the case of this embodiment of the invention, the switching output voltage of the field-effect transistor is monitored by the switch-off stage, which is activated in the event of a fault or short circuit in such a manner that the drive to the field-effect transistor is blocked immediately, and the output stage is thus changed to a non-critical state.

At the same time that the field-effect transistor drive is blocked, the charging of the timer is started. Once the charging of the timer has been completed, the switch-off release stage and the switch-off stage are blocked, as a result of which the blocking of the drive of the field-effect transistor is cancelled.

One particularly advantageous version of the invention provides that, in the event of a further existing fault or short circuit, the drive of the field-effect transistor is blocked again immediately, and in that the field-effect transistor is driven periodically briefly with the aid of the timer, until the fault is rectified.

This allows optimum protection of the output switching stage to be achieved, as well as an automatic change to normal operation of the circuit once the fault situation has been rectified.

An advantageous refinement of the short-circuit protection circuit according to the invention provides that the timer is formed by a transistor to whose emitter the potential of the source electrode of the field-effect transistor is applied, whose base is connected via an R/C element to the input of the field-effect transistor, and whose collector is connected to the switch-off release stage, via a capacitor to the emitter, and via a resistor to an operating voltage.

It is furthermore possible to provide for the switch-off release stage to be formed by a transistor to whose emitter the potential of the source electrode of the field-effect transistor is applied, whose base is connected via a voltage divider to the output of the timer, and whose collector is connected to an input of the switch-off stage.

The short-circuit protection circuit according to the invention can also be configured in such a manner that the switch-off stage is formed by a transistor to whose emitter the potential of the source electrode of the field-effect transistor is applied, whose base is connected to the output of the switch-off release stage and, via a voltage divider or an R/C element, to the sink electrode of the field-effect transistor, and whose collector is connected to the input of the field-effect transistor.

BRIEF DESCRIPTION OF THE DRAWINGS

With the above and other objects and other advantages in view, the present invention will become more clearly understood in connection with the detailed description of a preferred embodiment, when considered with the accompanying drawing of which.

DETAILED DESCRIPTION OF THE PREFERRED EMBODIMENT

Figure 1:
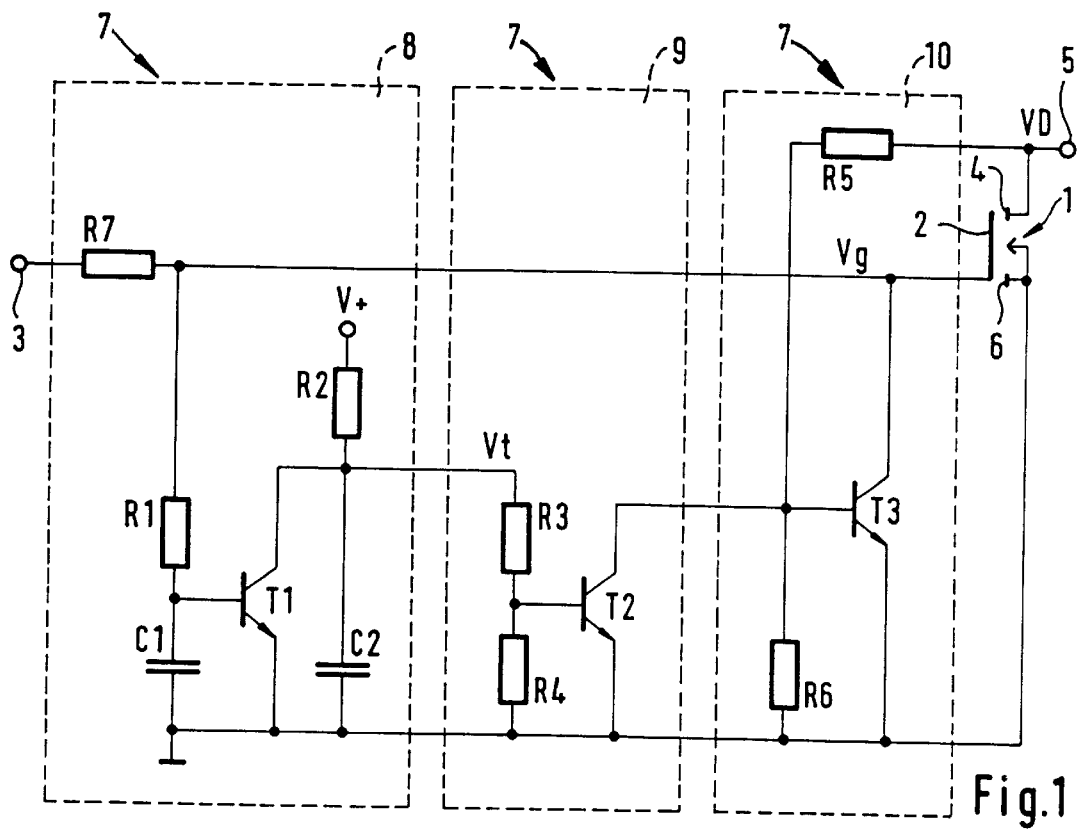
FIG. 1 shows a circuit diagram of an exemplary embodiment of the invention.

FIG. 1 shows a non-self-protected field-effect transistor 1, whose control electrode 2 (gate) is connected via a resistor R7 to the input 3, and whose sink electrode 4 (drain) is connected to the output 5, while its source electrode 6 (source) is connected to earth. This field-effect transistor 1, for which various types can be used depending on application, is now intended to be protected against overloads in the event of a short circuit, using the short-circuit protection circuit 7. The following fault sources are, by way of example, feasible in this case: short circuit between output 5 and earth or the output 5 and the vehicle supply voltage.

The protection circuit 7 in this case comprises a timer 8, a switch-off release stage 9 and a switch-off stage 10. The timer 8 essentially contains the time constant elements R1, C1 and R2, C2 as well as a transistor T1 as a switch for starting and resetting the timer. The switch-off release stage 9 comprises a voltage divider R3, R4 and a transistor T2, in which case the voltage divider is connected to the output of the timer 8. The switch-off stage 10 likewise comprises a voltage divider R5, R6, which is connected to the output voltage, as well as a transistor T3, which can be driven both by the voltage divider and by the output of the switch-off release stage 9. A capacitor can also be provided instead of the resistor R6. This avoids short current spikes leading on their own to the switch-off stage responding. The output of the transistor T3 is, finally, connected to the control electrode 2 of the field-effect transistor 1.

In the event of a fault, that is to say if a short circuit occurs, the low output voltage in normal operation will rise via the field-effect transistor 1 to a higher value, as a result of which the field-effect transistor and, possibly, the connected components can in the process be overheated and destroyed.

In the case of such a fault, the protection circuit 7 that is provided is activated immediately in that the transistor T3 is switched by the voltage drop measured across the voltage divider R5, R6 such that the control voltage which is applied to the electrode 2 of the field-effect transistor 1 is blocked. At the same time, however, a high current pulse occurs briefly, and the field-effect transistor 1 needs to be designed to be able to cope with this. At the same time that the output voltage is switched off, the charging of the timer 8 is started, by which means delay times that are as long as possible are intended to be achieved. Once the charging time has elapsed, that is to say once the timer 8 has been charged, both the switch-off release stage 9 and the switch-off stage 10 itself are blocked again. However, should the fault not have been rectified, then the switch-off process starts once again as described above. In this way, the protection circuit repeatedly tries to switch the output on again, periodically. However, as long as the fault is still present, it is switched off again immediately.

Figure 2A:
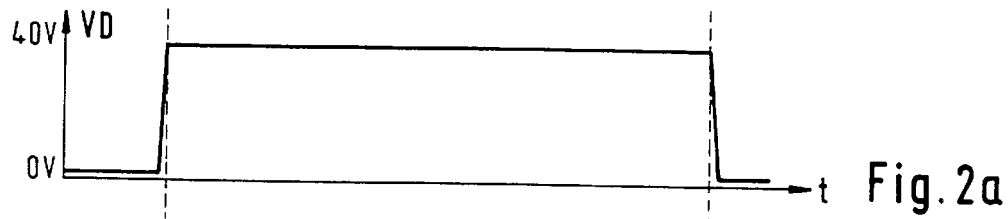
FIGS. 2a–2c show timing diagrams of voltages and currents that occur in the exemplary embodiment.
Figure 2B:
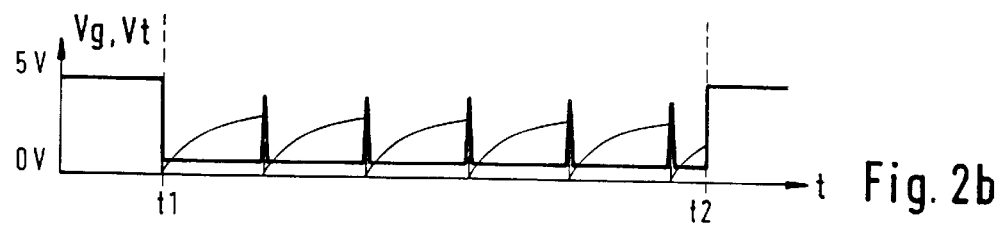
Figure 2C:
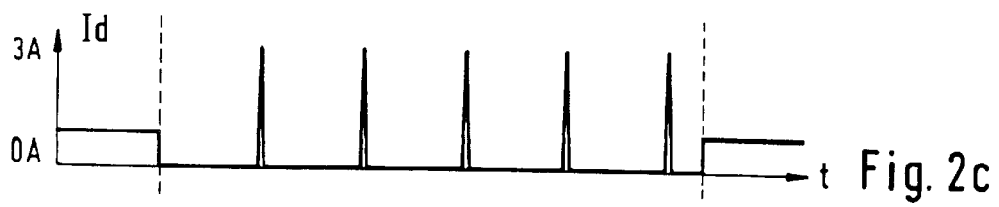

FIGS. 2a to 2c show schematically the waveforms of the voltages and currents in the circuit arrangement according to FIG. 1, the respective variables being indicated only approximately. FIG. 2a illustrates the voltage across the field-effect transistor 1, which rises from a low value in the switched-on stage in normal operation at the start of a short circuit at t1 to a high value, and falls away again whilst the short circuit ends at t2.

At the start of the short circuit, at 1, the voltage Vg (FIG. 2b) which is supplied per se for drive purposes to the control electrode via the resistor R5 and the transistor T3, is very quickly reduced to a low value, so that the field-effect transistor is blocked. The capacitor C2 is then charged slowly. Once its voltage Vt has reached a value which has led to the transistor 2 being switched on, the transistor T3 is closed, so that the field-effect transistor 1 is switched on as a consequence of the voltage at the input 3. Immediately after this, the transistor T3 is switched on again via the voltage divider R5/R6, so that the field-effect transistor 1 is blocked again. This process is thus repeated frequently until the short circuit ends at t2. After this, the normal control voltage Vg is applied to the control electrode 2 of the field-effect transistor 1 once again.

FIG. 2c shows the current Id through the field-effect transistor 1. During normal operation, a current flows which is governed by the load. At the start of the short circuit and during the attempt to switch on the field-effect transistor, a considerably higher current flows, as can be seen by the current spikes in FIG. 2c.

What is claimed is:

1. Short-circuit protection circuit for a switching output having a non-self-protected semiconductor switch with a control electrode for receipt of a control voltage from an input terminal of the circuit, the protection circuit comprising a series circuit connecting with the control electrode;

wherein the series circuit comprises a timer, a switch-off release stage connecting to an output of the timer, and a switch-off stage connecting between an output of the switch-off release stage and the control electrode of the non-self-protected semiconductor switch;

the non-self-protected semiconductor switch is a field effect transistor;

the timer comprises a transistor (T1) having an emitter receiving potential of the source electrode of the field-effect transistor;

the timer further comprises a series circuit of capacitor (C1) and resistor (R1) wherein a junction of the resistor (R1) and the capacitor (C1) is connected to a base of the transistor (T1), and a terminal of the resistor (R1) opposite the junction connects with the control electrode of the field effect transistor;

the timer further comprises a capacitor (C2), a resistor (R2), and a collector of the transistor (T1) connected to the switch-off release stage, the capacitor (C2) connects between the collector of the transistor (T1) and the emitter of the transistor (T1), and the resistor (R2) connects between the collector of the transistor (T1) and an operating voltage.

2. Short-circuit protection circuit according to claim 1, wherein a switching output voltage of the field-effect transistor is monitored by the switch-off stage; and activation of the switch-off stage occurs in the event of a fault or short circuit in such a manner that a drive signal at the control electrode of the field-effect transistor is blocked immediately, and an output voltage of the field effect transistor is thus switched off.

3. Short-circuit protection circuit according to claim 2, wherein, concurrently with a blocking of the field-effect transistor drive, a charging of the timer is started, and upon completion of the charging of the timer, the switch-off release stage and the switch-off stage are disabled, as a result of which the blocking of the drive of the field-effect transistor is cancelled.

4. Short-circuit protection circuit according to claim 3, wherein, in the event of a further fault or short circuit existing, the drive of the field-effect transistor is immediately blocked again, and the field-effect transistor is driven periodically briefly with the aid of the timer, until the fault is rectified.

5. Short-circuit protection circuit according to claim 1, wherein:

the switch off release stage comprises a transistor (T2) and a voltage divider comprising resistors (R3, R4);

an emitter of the transistor (T2) receives potential of the source electrode of the field-effect transistor;

a base of the transistor (T2) is connected via the voltage divider (R3, R4) to the output of the timer; and a collector of the transistor (T2) is connected to an input of the switch-off stage.

6. Short-circuit protection circuit according to claim 1, wherein;

the switch off stage comprises a transistor (T3) and a voltage divider comprising resistors (R5, R6);

an emitter of the transistor (T3) receives potential of the source electrode of the field-effect transistor;

the base of the transistor (T3) is connected to an output of the switch-off release stage and, via the voltage divider (R5, R6), is connected to a sink electrode of the field-effect transistor; and the collector of the transistor (T3) is connected to the control electrode of the field-effect transistor.

7. Short-circuit protection circuit according to claim 1, wherein the switch-off stage comprises a resistor (R5), and a transistor (T3) having an emitter receiving potential of the source electrode of the field-effect transistor;

the transistor (T3) has a base connected to the output of the switch-off release stage, and connects via the resistor (R5) to a sink electrode of the field-effect transistor; and connected to the control electrode of the field-effect transistor.

* * * * *